(12) United States Patent
Lum et al.

(10) Patent No.: US 9,087,565 B2
(45) Date of Patent: Jul. 21, 2015

(54) PRE-CHARGING A DATA LINE

(71) Applicants: Annie-Li-Keow Lum, San Jose, CA (US); Derek C. Tao, Fremont, CA (US)

(72) Inventors: Annie-Li-Keow Lum, San Jose, CA (US); Derek C. Tao, Fremont, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 103 days.

(21) Appl. No.: 13/793,815

(22) Filed: Mar. 11, 2013

(65) Prior Publication Data

US 2014/0140158 A1 May 22, 2014

Related U.S. Application Data

(60) Provisional application No. 61/728,460, filed on Nov. 20, 2012.

(51) Int. Cl.
*G11C 7/00* (2006.01)
*G11C 7/12* (2006.01)
*G11C 7/10* (2006.01)
*G11C 11/419* (2006.01)

(52) U.S. Cl.
CPC ............... *G11C 7/12* (2013.01); *G11C 7/1048* (2013.01); *G11C 11/419* (2013.01)

(58) Field of Classification Search
USPC .................... 365/203, 183, 189.09
See application file for complete search history.

(56) References Cited

U.S. PATENT DOCUMENTS

| | | | | | |
|---|---|---|---|---|---|
| 5,079,742 | A | * | 1/1992 | Simpson | 365/104 |
| 5,103,423 | A | * | 4/1992 | Miyazaki et al. | 365/189.11 |
| 6,160,733 | A | * | 12/2000 | Ebel | 365/154 |
| 6,462,999 | B1 | * | 10/2002 | Amano | 365/205 |
| 6,636,445 | B2 | * | 10/2003 | Ohshima et al. | 365/190 |
| 7,006,067 | B2 | * | 2/2006 | Tobita et al. | 345/92 |
| 8,004,879 | B2 | * | 8/2011 | Uno | 365/154 |
| 8,077,533 | B2 | * | 12/2011 | Hunter et al. | 365/203 |

* cited by examiner

*Primary Examiner* — Alexander Sofocleous
*Assistant Examiner* — Minh Dinh
(74) *Attorney, Agent, or Firm* — Lowe Hauptman & Ham, LLP

(57) ABSTRACT

A control circuit includes a data driver, a charge circuit, and a first data line coupled with the data driver and the charge circuit. The charge circuit is configured to charge the first data line when the first data line is selected for accessing a memory cell corresponding to the first data line and to not charge the first data line when the first data line is not selected for accessing the memory cell. The data driver, based on a first control signal, is configured to transfer a signal on the first data line to an output of the data driver.

20 Claims, 7 Drawing Sheets

| | CLK | CSL | CLKCSLB | CLKCSL | CSLPC |
|---|---|---|---|---|---|
| 610 → | 0 | 0 | 1 | 0 | 1 |
| 620 → | 0 | 1 | 1 | 0 | 0 |
| 630 → | 1 | 0 | 1 | 0 | 1 |
| 640 → | 1 | 1 | 0 | 1 | 1 |

FIG. 6

PRE-CHARGING A DATA LINE

CROSS-REFERENCE TO RELATED APPLICATION

The present application claims the priority of U.S. Provisional Application No. 61/728,460, filed Nov. 20, 2012, the disclosure of which is incorporated herein by reference in its entirety.

FIELD

The present disclosure is related to pre-charging a data line.

BACKGROUND

In some existing approaches, a memory array, such as a static random access memory (SRAM) array, uses read bit lines for data outputs. The read bit lines are also called data lines because the read bit lines carry logical values that reflect data stored in the memory cells to be read, for example. The read bit lines include local read bit lines and global read bit lines. In some approaches, with reference to a current read operation of a memory cell, a corresponding global read bit line of a memory macro is pre-charged to a high logical value at the end of a prior read operation. Read bit lines of memory cells not to be read are also pre-charged at the end of the prior read operation. During the current read operation, depending on the logical value of the data stored in the memory cell to be read, the corresponding global read bit line is discharged to reflect the logical value of the data stored in the memory cell to be read. Read bit line pre-charging and discharging consume electrical power, however.

BRIEF DESCRIPTION OF THE DRAWINGS

The details of one or more embodiments of the disclosure are set forth in the accompanying drawings and the description below. Other features and advantages will be apparent from the description, drawings, and claims.

FIG. 6 is a truth table of the circuit in FIG. 5, in accordance with some embodiments.

Like reference symbols in the various drawings indicate like elements.

DETAILED DESCRIPTION

Figure 1:
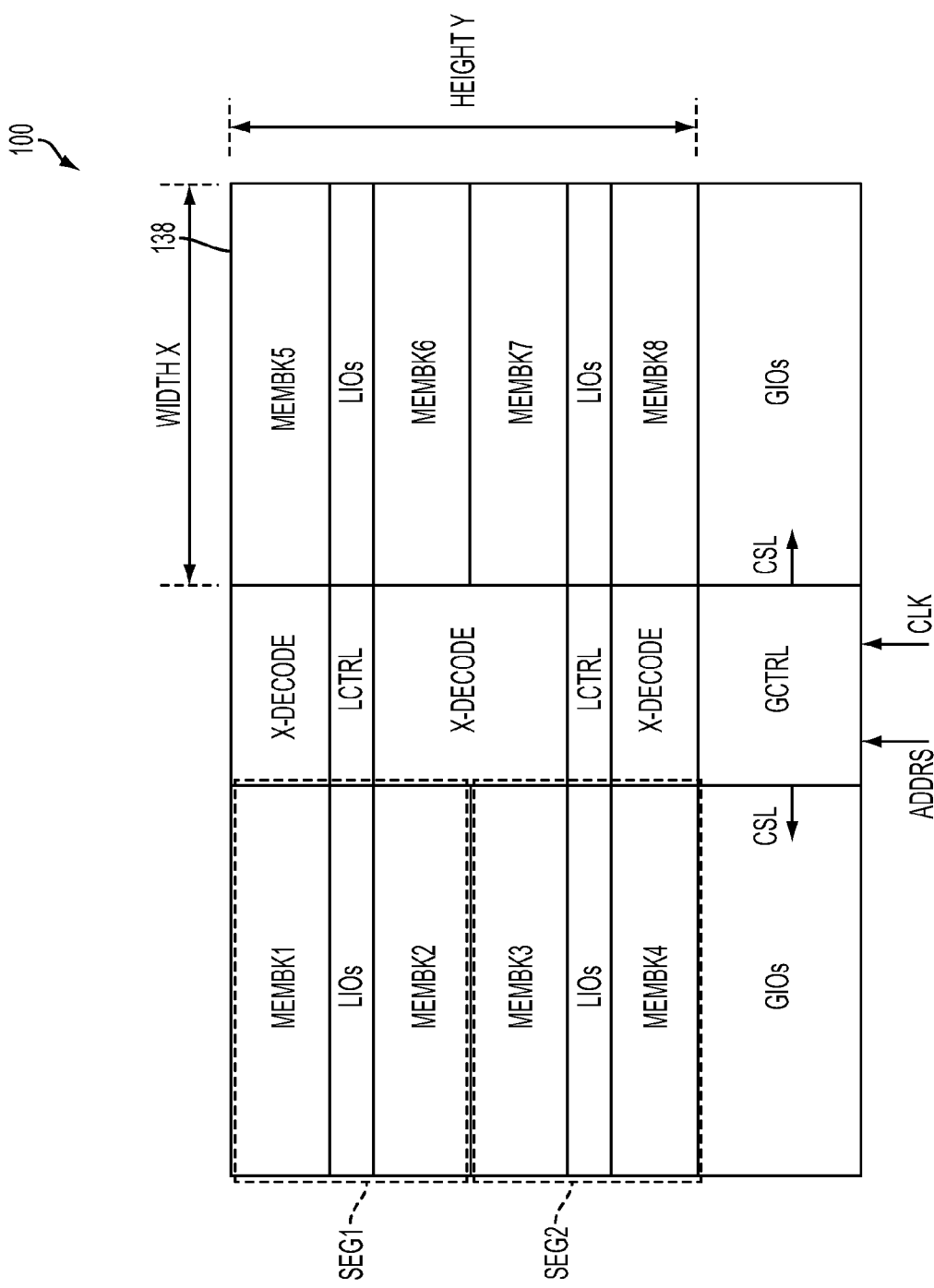
FIG. 1 is a diagram of a memory macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. Selected global bit lines corresponding to memory cells to be read are pre-charged at the beginning of a current read operation. Un-selected global read bit lines corresponding to memory cells not to be read are not pre-charged. As a result, electrical power for read operations is reduced compared with situations in which all global bit lines are pre-charged at the end of a prior read operation to be used in the current read operation.

Memory Macro

FIG. 1 is a diagram of a memory macro 100, in accordance with some embodiments. In the embodiment of FIG. 1, memory macro 100 is a static random access memory (SRAM) macro. SRAM is used for illustration. Other types of memories are within the scope of various embodiments.

Memory macro 100 is symmetrical. For example, with reference to decoders X-Decode, local control circuits (LCTRLs), or a global control circuit (GCTRL), circuit elements on the left side of memory macro 100 are similar to circuit elements on the right side of memory macro 100. For another example, memory macro 100 includes two memory arrays. One memory array is on the left side of memory macro 100 and one memory array is on the right side of memory macro 100. For illustration, one memory array on the right side of memory macro 100 is labeled memory array 138 that has a width X and a height Y.

Memory array 138 includes a plurality of memory segments. For illustration, two memory segments SEG1 and SEG2 of the memory array on the left of memory macro 100 are shown. A different number of memory segments is within the scope of various embodiments.

Each memory segment includes two memory banks. For example, memory segment SEG1 includes two memory banks MEMBK1 and MEMBK2, and memory segment SEG2 includes two memory banks MEMBK3 and MEMBK4. For illustration, only memory segments SEG1 and SEG2 are labeled. Details of other memory banks MEMBK5, MEMBK6, MEMBK7, and MEMBK8 of memory segments other than memory segments SEG1 and SEG2 are not labeled.

In a memory segment, two memory banks share a row of a local input-output circuit LIO. For example, memory bank MEMBK1 and memory bank MEMBK2 share one row of LIOs, memory bank MEMBK3 and memory bank MEMBK4 share one row of LIOs, memory bank MEMBK5 and memory bank MEMBK6 share one row of LIOs, and memory bank MEMBK7 and memory bank MEMBK8 share one row of LIOs.

Memory cells in a memory bank are arranged in rows and columns. As a result, memory cells in a memory segment and in a memory array are also arranged in rows and columns. A memory cell is described with reference to FIG. 2 below, and is labeled MEMCELL. Different configurations of a memory segment are within the scope of various embodiments.

Based on an address ADDRS of a memory cell to be accessed for a read or a write operation, an address decoder X-Decode provides the row-address of the corresponding memory cell to be accessed.

A local control LCTRL controls a corresponding local LIO.

A global input-output circuit GIO serves to transfer data between memory cells in a corresponding memory array and other circuits outside of memory macro 100.

Global control GCTRL provides the row address, the column address pre-decode, clock, and other signals for memory macro 100. Global control GCTRL also controls data transfer between memory cells in the memory array and circuits outside of memory macro 100. For example, global control GCTRL, based on a clock signal CLK and address ADDRS of a memory cell to be read, generates a column select signal CSL to select a column to be pre-charged, to be read, etc.

Memory Cell

Figure 2:
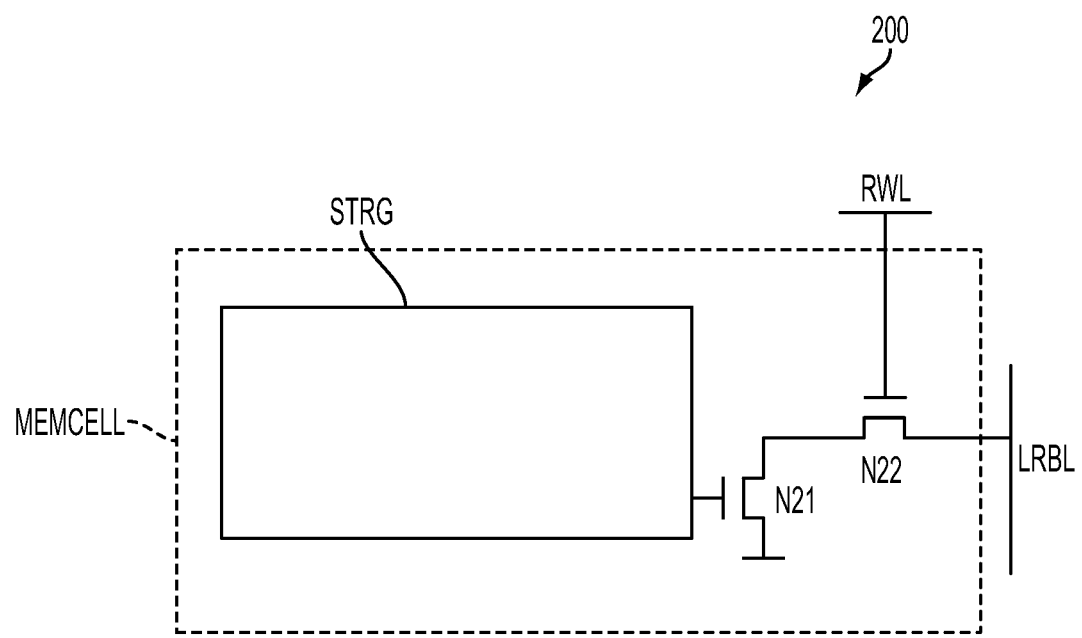
FIG. 2 is a diagram of a memory cell of the memory macro in FIG. 1, in accordance with some embodiments.

FIG. 2 is a diagram of a circuit 200, in accordance with some embodiments. Circuit 200 includes a memory cell MEMCELL coupled with a read word line RWL and a read bit line LRBL. Read bit line LRBL is also call a local read bit line, which is distinguished from a global read bit line GRBL shown in FIG. 3.

Memory cell MEMCELL includes a storage unit STRG and a read port that includes two N-type metal oxide semiconductor (NMOS) transistors N21 and N22.

A gate of transistor N21 receives data from storage unit STRG. A source of transistor N21 receives a supply reference voltage, which, in some embodiments, is ground. A drain of transistor N21 is coupled with a source of transistor N22. A gate of transistor N22 is coupled with read word line RWL. A drain of transistor N22 is coupled with read bit line LRBL. In some embodiments, read word line RWL is coupled with each gate of each transistor N22 in a row of memory cells MEMCELL in a memory bank. Further, read bit line LRBL is coupled with each drain of each transistor N22 in a column of memory cells MEMCELL in a memory bank.

When memory cell MEMCELL is accessed for a read operation, detecting a logical value on read bit line LRBL reveals the logical data stored in memory MEMCELL. For example, in some embodiments, in a read operation, read bit line LRBL is pre-charged with a high logical value. Pre-charge refers to charging before a read or a write operation. Further, read word line RWL is activated with a high logical value. As a result, transistor N22 is turned on. In some embodiments, when storage unit STRG stores a high logical value, storage unit STRG provides a low logical value to the gate of transistor N21. Consequently, transistor N21 is turned off, and transistors N21 and N22 function as an open circuit. Read bit line LRBL therefore remains at the pre-charged high logical value. In other words, the high logical value on read bit line LRBL corresponds to the high logical data stored in storage unit STRG.

In contrast, when storage unit STRG stores a low logical value, storage unit STRG provides a high logical value to the gate of transistor N21. As a result, transistor N21 is turned on. Because transistors N21 and N22 are turned on, read bit line LRBL is pulled to a low logical value at the source transistor N21. In other words, the low logical value on read bit line LRBL corresponds to the low logical value of the data stored in storage unit STRG.

In some embodiments, reading the data on local read bit line LRBL is by reading the data on a corresponding global read bit line GRBL and is explained below.

Memory Array

Figure 3:
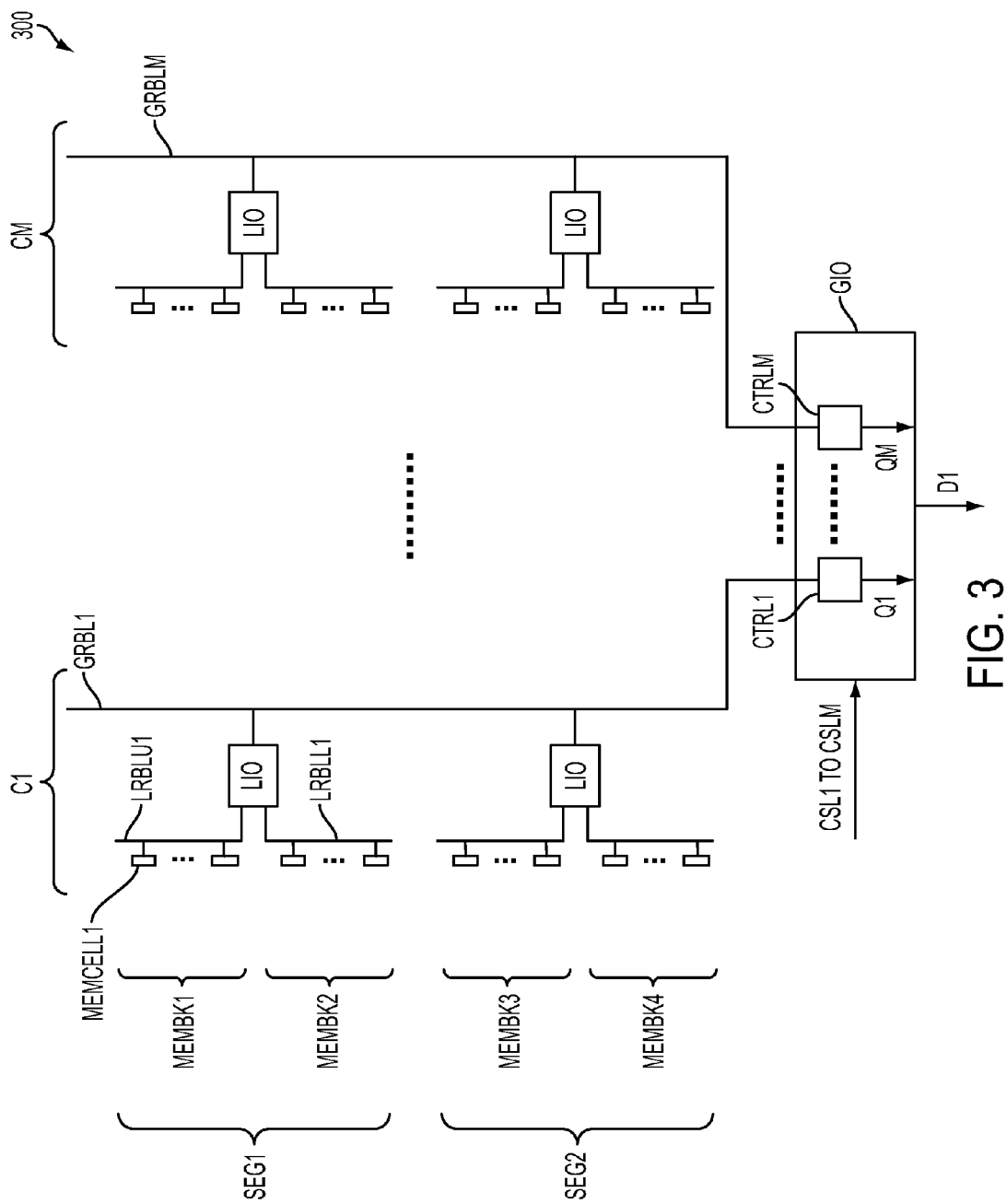
FIG. 3 is a diagram of a portion of a memory array of the memory macro in FIG. 1, in accordance with some embodiments.

FIG. 3 is a diagram of a portion 300 of memory array 138 in FIG. 1, in accordance with some embodiments. Memory array 138 includes a plurality of memory array portions 300.

Memory array portion 300 includes M columns labeled column C1 to CM, wherein M is an integer number. For illustration, a column C1 to CM is called a column C. Each column C includes a plurality of local input-output LIOs corresponding to a plurality of segments. In the illustration of FIG. 3, memory array portion 300 includes two segments SEG1 and SEG2. Each of segments SEG1 and SEG2 in turn includes a local input-output LIO in a column C.

A local input-output (LIO) is coupled with two local read bit lines LRBL and a global read bit line GRBL. An LIO is also called a data circuit. For example, in FIG. 3, an LIO of column C1 is coupled with two local read bit lines LRBLU1 and LRBLL1 and a global read bit line GRBL1. Another number of local read bit line coupled with an LIO is within the scope of various embodiments. Each local read bit line LRBL, such as a local read bit line LRBLU1 or LRBLL1, is coupled with a plurality of memory cells MEMCELL and a local pre-charge circuit LPRCH. For simplicity, one memory cell MEMCELL1 to be read is labeled, and the local pre-charge circuit LPRCH is not shown in FIG. 3, but is shown and explained with reference to FIG. 4. Circuit connections between memory cell MEMCELL with local read bit line LRBL are described above with reference to FIG. 2. Memory cells MEMCELL coupled with the corresponding read bit line LRBL belong to a corresponding segment. For example, with reference to a column C, memory cells MEMCELL coupled with read bit line LRBLU1 of segment SEG1 belong to memory bank MEMBK1. Memory cells MEMCELL coupled with read bit line LRBLL1 of segment SEG1 belong to memory bank MEMBK2 of segment SGE1. Memory cells MEMCELL coupled with two read bit lines of segment SEG2 belong to memory banks MEMBK3 and MEMBK4, respectively, etc.

A plurality of global read bit lines GRBL1 to GRBLM is coupled with a global input-output (GIO) circuit in FIG. 1. When the data stored in a memory cell is read, the data is reflected on a corresponding local read bit line, local input-output LIO, and a global read bit line. The data is then controlled by a corresponding control circuit CTRL1 to CTRLM to a corresponding output Q1 to QM, and is provided to circuits outside of memory macro 100 as a data line D1. In such a condition, when memory array 138 includes N memory portions 300, memory array 130 also includes N data lines from data line D1 to data line DN (not shown), wherein N is integer number. For example, as shown in FIG. 3, when the data stored in memory MEMCELL1 is read, the data is reflected on local read bit line LRBLU1, local input-output LIO, global read bit line GRBL1, and is transferred by control circuit CTRL1 to output Q1 and data line D1. For illustration, a global read bit line GRBL1 to GRBLM is called a global read bit line GBRL.

In some embodiments, in a read operation of a memory cell MEMCELL, a corresponding global read bit line GRBL is pre-charged. Global read bit lines GRBL of memory cells that are not read are not pre-charged. A read operation of a memory cell MEMCELL is explained below with reference to FIG. 4. For illustration, memory cell MEMCELL1 in column C1 is read. Global read bit line GRBL1 of column C1 is pre-charged, but global read bit lines GRBL2 to GRBLM of columns C2 to CM are not pre-charged. As a result, embodiments of the present disclosure are advantageous over other approaches. For example, in the other approaches, in a read operation, the read data is transferred to the corresponding local read bit line LRBL and global read bit line GRBL1 of column C1. After the read data is no longer needed on global read bit line GRBL1 of column C1, all global read bit lines GRBL1 to GRBLM of columns C1 to CM are pre-charged.

As a result, a read operation in those approaches consumes much more electrical power, compared with techniques of the present disclosure. In other words, techniques of various embodiments of the present disclosure save electrical power.

Global input-output (GIO) circuit receives read bit lines GRBL1 to GRBLM corresponding to columns C1 to CM. GIO circuit is also called a data circuit. GIO circuit, based on a column select signal CSL1 to CSLM, selects one global read bit line out of the plurality of global read bit lines GRBL1 to GRBLM to transfer data on the selected global read bit line as data on a corresponding output Q1 to QM to be read. In some embodiments, data on multiples global read bit lines each from a circuit GIO is read at the same time. For example, each circuit GIO of the plurality of circuits GIO (not shown) selects data on global read bit line GRBL1 of column C1 for reading. For another example, each circuit GIO of the plurality of circuits GIO selects data on global read bit line GRBL2 of column C2 for reading, and each circuit GIO of the plurality of circuits GIO selects data on global read bit line GRBL3 of column C3 for reading, etc.

A control circuit CTRL1 to CTRLM is used to control the data on a corresponding global read bit line GRBL1 to GRBLM to an output Q1 to QM, respectively. For illustration, a control circuit CTRL1 to CTRLM is called a control circuit CTRL, and is explained in detail with reference to FIG. 4. Each of the data on output Q1 to QM is then selected as data on data line D1.

Memory array portion 300 having two segments SEG1 and SEG2 is for illustration. A different number of segments in a memory array portion 300 is within the scope of various embodiments.

Circuits of the Memory Macro

Figure 4:
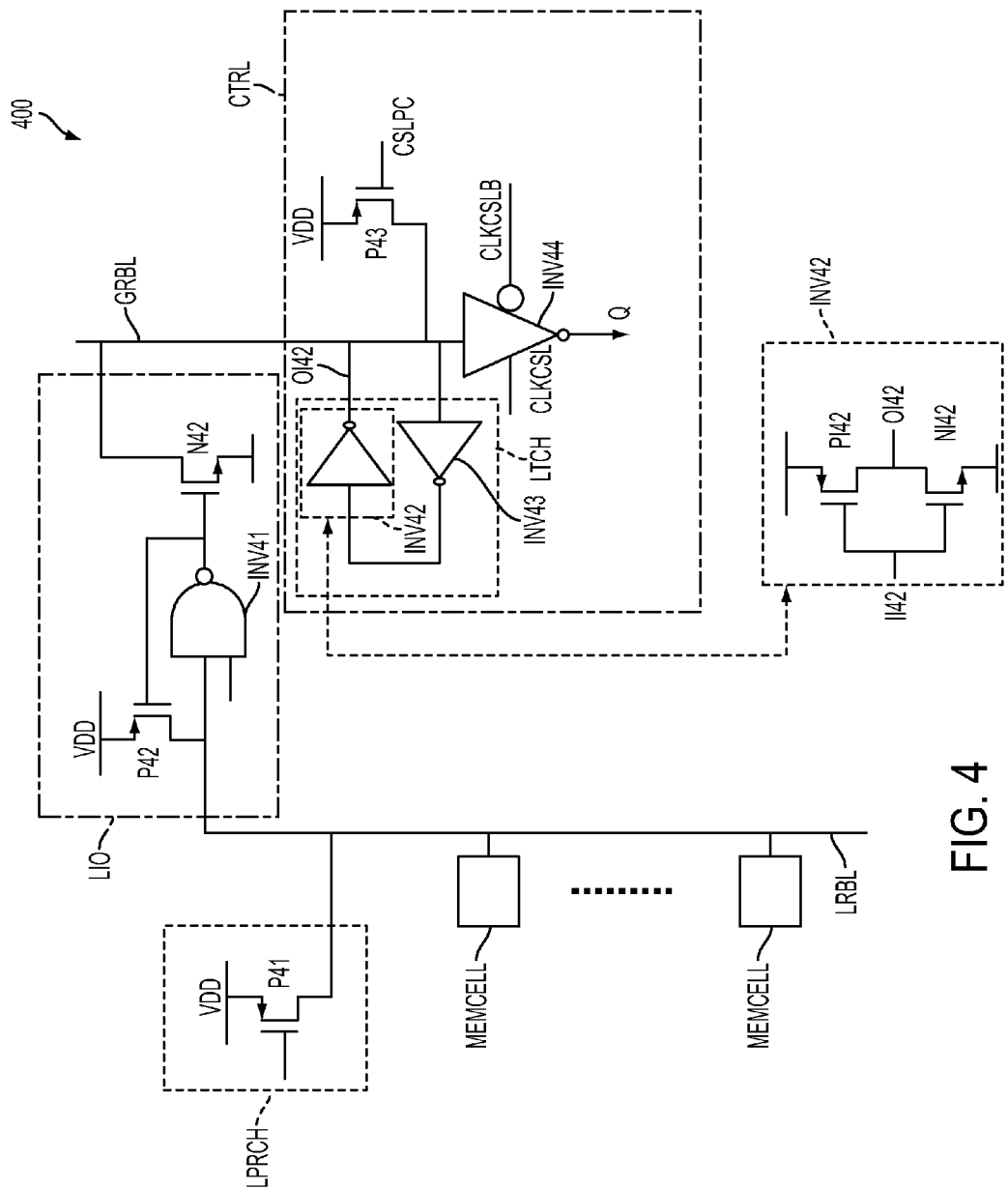
FIG. 4 is a diagram of a circuit including various circuits of the memory array portion in FIG. 3, in accordance with some embodiments.

FIG. 4 is a diagram of a circuit 400, in accordance with some embodiments. Circuit 400 is used to illustrate connections and operations of a local pre-charge circuit LPRCH, a local input-output LIO circuit, a control circuit CTRL, and a plurality of memory cells MEMCELL.

Local-pre-charge circuit LPRCH is used to pre-charge local read bit line LRBL. Circuit LPRCH is implemented by a PMOS transistor P41. For example, when transistor P41 is turned off, read bit line LRBL is electrically disconnected from circuit LPRCH. But when transistor P41 is turned on, read bit line LRBL is pulled to voltage VDD at a source of transistor P41. In other words, read bit line LRBL is pre-charged.

LIO circuit includes a PMOS transistor P42, an NMOS transistor N42, and a NAND gate, which, for illustration, is called an inverter INV41 because the NAND gate functions as an inverter when one input of the NAND gate is logically high. Two inputs of inverter INV41 each receive a local read bit line. For simplicity, however, only one local read bit line LRBL coupled with inverter INV41 is shown. For illustration, the other input of inverter INV41 is logically high. A source of PMOS transistor P42 receives supply voltage VDD. A gate of PMOS transistor P42 is coupled with an output of inverter INV41. A drain of PMOS transistor P42 is coupled with an input of inverter INV41 and with read bit line LRBL.

Transistor P42 and inverter INV41 operate to keep read bit line LRBL at a high logical value, such as after read bit line LRBL is pre-charged for a read operation. For example, when read bit line LRBL is logically high, the output of inverter INV41 coupled with the gate of PMOS transistor P42 is logically low. As a result, PMOS transistor P42 is turned on, which pulls read bit line LRBL coupled with the drain of PMOS transistor P42 to supply voltage VDD at the source of PMOS transistor P42. In other words, read bit line LRBL is kept at a high logical value.

NMOS transistor N42 is used to correspond a logical value of global read bit line GRBL to a logical value of a corresponding local read bit line LRBL. For example, when local read bit line LRBL is logically low, the output of inverter INV41 coupled with a gate of transistor N42 is logically high. As a result, transistor N42 is turned on, and global read bit line GRBL at a drain of transistor N42 is pulled to ground or a low logical value at a source of transistor N42. Effectively, when local read bit line LRBL is logically low, global read bit line GRBL is logically low.

In contrast, when local read bit line LRBL is logically high, inverter INV41 provides a low logical value at the gate of transistor N42. As a result, transistor N42 is turned off and functions as an open circuit. In some embodiments, in a read operation, global read bit line GRBL is pre-charged to a high logical value. When transistor N42 functions as an open circuit, global read bit line GRBL remains at the pre-charged high logical value. Explained in a different way, when local read bit line LRBL is logically high, global read bit line GRBL is also logically high. As a result, reading a logical value at global read bit line GRBL reveals the logical value at local read bit line LRBL.

Control circuit CTRL includes a data driver INV44, a PMOS transistor P43, and a latch LTCH. PMOS transistor P43 serves to pre-charge global read bit line GRBL. For example, when column select pre-charge signal CSLPC is activated with a low logical value, transistor P43 is turned on. As a result, global read bit line GRBL coupled with a drain of transistor P43 is pulled to supply voltage VDD at a source of transistor P43. In other words, global read bit line GRBL is pre-charged to a high logical value. A circuit used to generate signal CSLPC, signal CLKCSL, and signal CLKCSLB is explained in detail with reference to FIG. 5.

Latch LTCH includes an inverter INV42 and an inverter INV43. Latch LTCH operates to maintain a logical value of global read bit line GRBL. Inverter INV42 and inverter INV43 are configured similarly to each other. Inverter INV42 includes a PMOS transistor PI42 and an NMOS transistor NI42, as illustrated in detail at the lower part of FIG. 4. In some embodiments, a size of NMOS transistor N42 in LIO circuit is determined such that NMOS transistor N42 is able to pull global read bit line GRBL to voltage VSS or a low logical value at a source of NMOS transistor N42 within a predetermined time. In some embodiments, the size of NMOS transistor N42 is selected to be greater than the size of PMOS transistor PI42 so that when global read bit line GRBL is pulled to a low logical value at the source of NMOS transistor N42, transistor N42 provides sufficient current for such a pull to the low logical value. In some embodiments, circuit simulation is done to determine the relationship between the sizes of transistor N42 and of transistor PI42. In some embodiments, the size of NMOS transistor N42 is at least about ten times a size of PMOS transistor PI42. Other relationships between the sizes of NMOS transistor N42 and of PMOS transistor PI42 are within the scope of various embodiments.

A clocked column select signal bar CLKCSLB is an inverse logic of a clocked column select signal CLKCSL of a column C of memory macro 100. Data driver INV44 is used to gate the data on global read bit line GRBL. An inverter implemented as a data driver is for illustration. Other circuits, such as a buffer for example, are within the scope of various embodiments. For illustration, when column C corresponding to global read bit line GRBL is selected for reading, signal CLKCSL is activated with a high logical value and signal CLKCSLB is activated with a low logical value. As a result, driver INV44 is activated to transfer the data on global read bit line GRBL to output Q of driver INV44. In other words, the data on global read bit line GRBL is read. In contrast, when signal CLKCSL is deactivated with a low logical value and signal CLKCSLB is deactivated with a high logical value, driver INV44 is deactivated, the data on global read bit line GRBL is not transferred to output Q of driver INV44. Explained in a different way, the data on global read bit line GRBL is not read. Both signals CLKCSL and CLKCSLB used for activating and deactivating driver INV44 are for illustration. Using either one of signals CLKCSL and CLKCSLB to activate and deactivate driver INV44 is within the scope of various embodiments.

In some embodiments, a control circuit CTRL corresponds to a global read bit line GRBL. For example, a control circuit CTRL1 to CTRLM corresponds to a global read bit line GRBL1 to GRBLM, respectively. As a result, global read bit line GRBL of a column C is pre-charged or discharged independently from global read bit lines GRBL of other columns C. For illustration, the accessed memory cell MEMCELL1 in FIG. 3 corresponds to column C1. As a result, in a read operation, only global read bit line GRBL1 of column C1 is pre-charged and discharged as applicable while global read bit lines GRBL2 to GRBLM of columns C2 to CM are not pre-charged and/or discharged. Consequently, various embodiments of the present disclosure are advantageous over other approaches because, in the various embodiments, electrical power is saved from not pre-charging and discharging global read bit lines GRBL2 to GRBLM in un-accessed columns C2 to CM.

In contrast, in another approach, transistors corresponding to PMOS transistor P43 in all columns of the memory macro are controlled by a single global pre-charge signal, for example. Further, in the other approach, at the end of the current read cycle, the global pre-charge signal is activated to turn on transistors corresponding to transistor P43. As a result, all global read bit lines of the memory macro of the other approach are pre-charged for a subsequent read cycle. Depending on the data stored in the accessed memory cells, the global read bit lines in the other approach are discharged as appropriate. In such a condition, the memory macro in the other approach consumes a lot more power than memory macro 100 of the present disclosure due to pre-charging and discharging all global read bit lines.

Circuit to Generate Signals CLKCSL, CLKCSLB, and CSLPC

Figure 5:
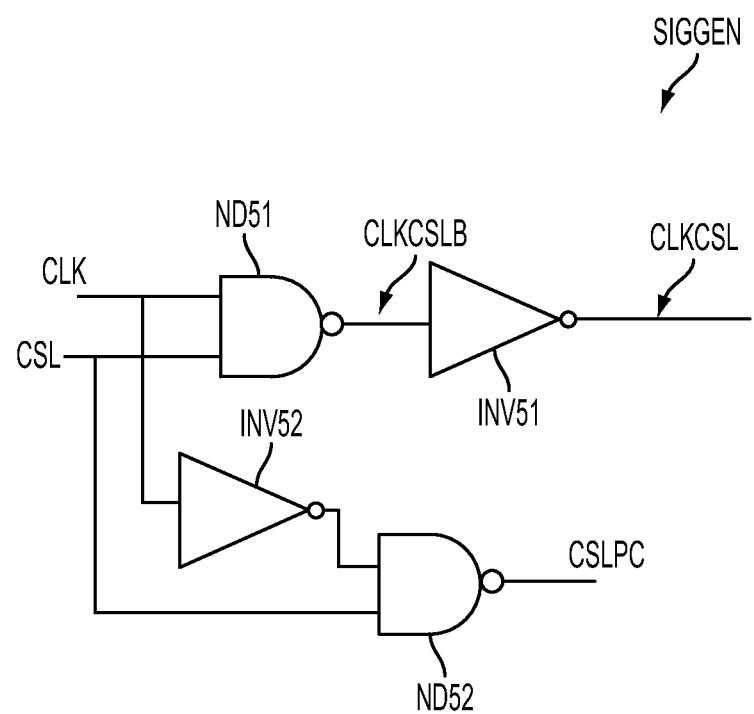
FIG. 5 is a diagram of a circuit that generates various signals of the circuit in FIG. 4, in accordance with some embodiments.

FIG. 5 is a diagram of a circuit SIGGEN, in accordance with some embodiments. Circuit SIGGEN is used to generate signal CLKCSL, signal CLKCSLB, and signal CSLPC. Circuit SIGGEN includes a NAND gate ND51, an inverter INV51, an inverter INV52, and a NAND gate ND52. Other logic gates and circuits used to implement functionalities of circuit SIGGEN are within the scope of various embodiments. For example, a NAND gate is implemented as an AND gate followed by an inverter. An inverter is implemented by a NAND gate having inputs coupled together, etc.

In some embodiments, circuit SIGGEN corresponds to circuit CTRL in FIG. 4. For example, each of a circuit SIGGEN1 to circuit SIGGENM (not labeled) corresponds to each of a circuit CTRL1 to CTRLM in FIG. 3, respectively.

Operations of circuit SIGGEN are explained with reference to a truth table 600 in FIG. 6. In table 600, based on operations of NAND gate ND51, inverter INV51, inverter INV52, and NAND gate ND52, logical values of signal CLKCSLB, signal CLKCSL, and signal CSLPC are obtained based on logical values of signals CLK and CSL. Further, a low logical value is indicated by a "0," while a high logical value is indicated by a "1."

For illustration, a global read bit line GRBL corresponding to a memory cell to be accessed is called a selected global read bit line GRBL while a global read bit line corresponding to an un-accessed memory cell in a same read operation with the memory cell to be accessed is called an un-selected global read bit line. In some embodiments, column select signal CSL of a selected global read bit line GRBL is activated with a high logical value while column select signal CSL of an un-selected global read bit line GRBL is deactivated with a low logical value.

With reference to line 610 in table 600, column select signal CSL of an un-selected global read bit line GRBL is logically low. When signal CLK is logically low, signal CSLPC corresponding to the un-selected global read bit line is logically high. As a result, transistor P43 in FIG. 4 is turned off, and the un-selected global read bit line GRBL is not pre-charged. Further, signal CLKCSLB is logically high, signal CLKCSL is logically low, and driver INV44 in FIG. 4 is deactivated. Data on the un-selected global read bit line GRBL is therefore not transferred to output Q for reading.

With reference to line 620, column select signal CSL of a selected global read bit line GRBL is logically high. When signal CLK is logically low, signal CSLPC of the selected global read bit line GRBL is logically low. As a result, transistor P43 in FIG. 4 is turned on, and the selected global read bit line GRBL is pre-charged to voltage VDD at the drain of transistor P43. Further, signal CLKCSLB is logically high, signal CLKCSL is logically low, and driver INV44 in FIG. 4 is deactivated. Data on the selected global read bit line GRBL is therefore not transferred to output Q for reading.

With reference to line 630, column select signal CSL of an un-selected global read bit line GRBL is logically low. When signal CLK is logically high, signal CSLPC of the un-selected global read bit line is logically high. As a result, transistor P43 in FIG. 4 is turned off, and the un-selected global read bit line GRBL is not pre-charged. Further, signal CLKCSLB is logically high, signal CLKCSL is logically low, and driver INV44 in FIG. 4 is deactivated. Data on the un-selected global read bit line GRBL is therefore not transferred to output Q for reading.

With reference to line 640, column select signal CSL of a selected global read bit line GRBL is logically high. When signal CLK is logically high, signal CSLPC of the selected global read bit line is logically high. As a result, transistor P43 in FIG. 4 is turned off, and the selected global read bit line GRBL is not pre-charged. Further, signal CLKCSLB is logically low, signal CLKCSL is logically high, and driver INV44 in FIG. 4 is activated. Data on the selected global read bit line GRBL is therefore transferred to output Q for reading.

Exemplary Method

In some embodiments, a memory cell MEMCELL in each column C, such as a column C1 to column CM, of a plurality of memory array portions 300 in FIG. 3 is read at the same time in a read operation. For simplicity, however, one memory cell, such as memory cell MEMCELL1, in one column C1 of one memory array portion 300 in FIG. 3 is used for illustration. Reading memory cells in columns C1 of other memory array portions 300 is similar. Reading memory cells in each of columns C2 to CM of a plurality of memory array portions 300 is similar to reading memory cells in columns C1 of the plurality of memory array portions 300.

Figure 7:
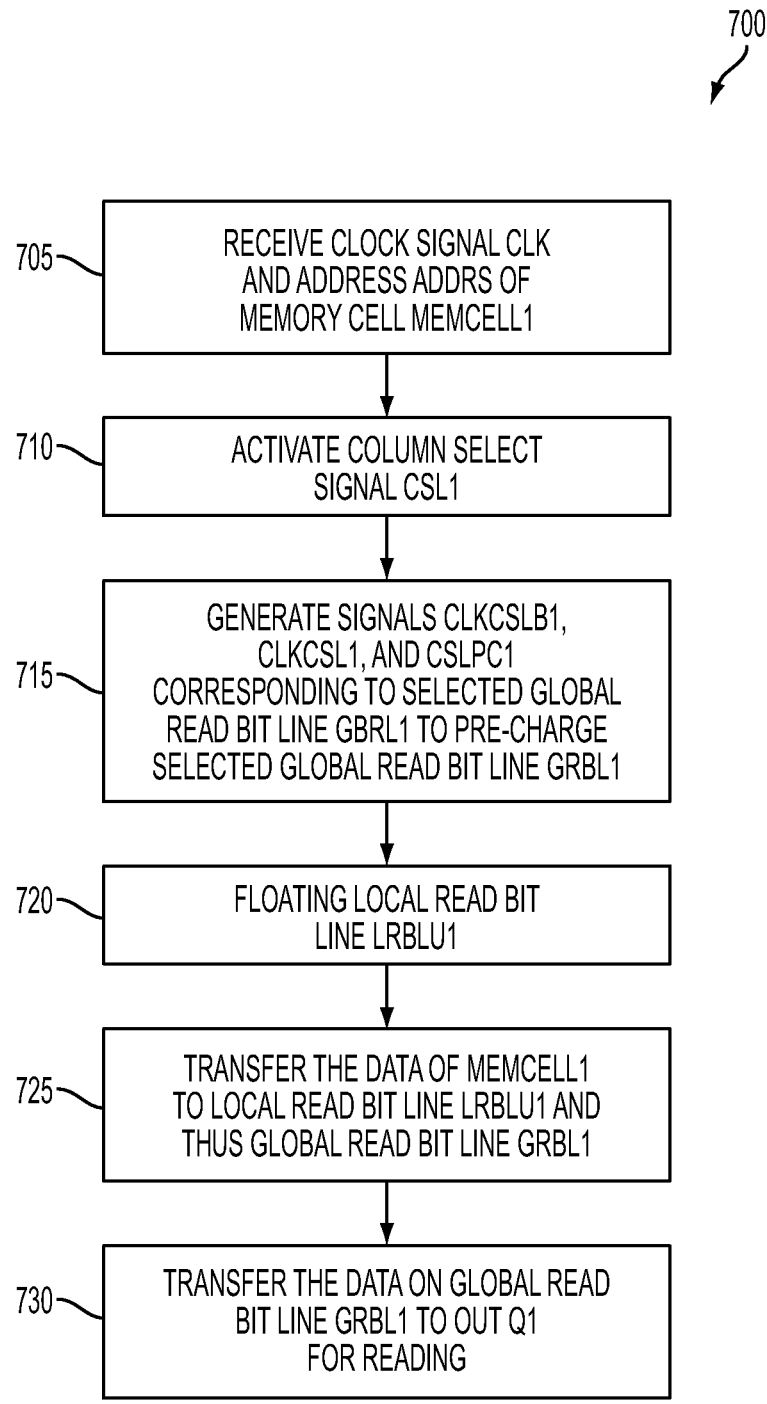
FIG. 7 is a flowchart of a method of reading a memory cell in the memory macro of FIG. 1, in accordance with some embodiments.

FIG. 7 is a flowchart of a method 700 for reading memory cell MEMCELL1 of FIG. 3, in accordance with some embodiments. Further, in various embodiments of the present disclosure, at the beginning of a read operation, column select signals CSL1 to CSLM corresponding to columns C1 to CM in FIG. 3 are logically low. As a result, signals CSLPC1 to CSLPCM are logically high, which turn off corresponding transistors P43 in FIG. 4. Global read bit lines GRBL1 to GRBLM of columns C1 to CM are therefore floating.

In operation 705, memory macro 100 in FIG. 1 receives clock signal CLK and address ADDRS of memory cell MEMCELL1 to be read.

In operation 710, global control GCTRL recognizes column C1 based on the address ADDRS of memory cell MEMCELL1 to be read. Global control GCTRL thus generates a high logical value to activate column select signal CSL1 corresponding to column C1. Column select signals CSL2 to CSLM corresponding to column C2 to column CM remain at a low logical value.

In operation 715, circuit SIGGEN in FIG. 5 generates signals CLKCSLB1, CLKCSL1, and CSLPC1 corresponding to global read bit line GBRL1 of column C1. For example, when clock signal CLK is logically low and signal CSL1 is logically high, circuit SIGGEN generates signals CLKCSLB1, CLKCSL1, and CSLPC1 to have a high, a low, and a low logical value, respectively, in accordance with line 620 of table 600 in FIG. 6. As a result, selected global read bit line GRBL1 is pre-charged to a high logical value, and the data on selected global read bit line GRBL1 is not transferred to output Q1 for reading.

Because signals CSL2 to CSLM corresponding to un-selected global read bit lines GRBL2 to GRBLM remain at a low logical value, and clock signal CLK is logically low in accordance with line 610, circuits SIGGEN2 to SIGGENM generate signals CLKCSLB2 to CLKCSLBM (not labeled in the drawings), signals CLKCSL2 to CLKCSLM (not labeled in the drawings), and signals CSLPC2 to CSLPCM (not labeled in the drawings) to be logically high, low, and high, respectively. Effectively, un-selected global read bit lines GRBL2 to GRBLM are not pre-charged, and the data on un-selected global read bit line GRBL2 to GRBLM are not transferred to outputs Q2 to QM for reading. In some embodiments, global read bit lines GRBL2 to GRBLM of unselected columns C2 to CM therefore continue to be floating.

In some embodiments, PMOS transistor P41 of local pre-charge circuit LPRCH corresponding to global read bit line GRBL1 has been turned on, and local read bit line LRBLU1 corresponding to global read bit line GRBL1 has been pre-charged. The output of inverter INV41 in FIG. 4 is therefore logically low, and transistor N42 is turned off. Local read bit line LRBLU1 and global read bit line GRBL1 are therefore electrically disconnected.

In operation 720, PMOS transistor P41 in FIG. 4 is turned off so that local read bit line LRBLU1 is floating at the pre-charged high logical value.

In operation 725, the data stored in memory cell MEMCELL is transferred to local read bit line LRBLU1. As explained above, if local read bit line LRBLU1 is logically low, global read bit line GRBL1 is also logically low because global read bit line GRBL is pulled to a low logical value at the source of transistor N42. In contrast, if local read bit line LRBLU1 is logically high, global read bit line GRBL1 continues to be logically high at the pre-charged high level. Effectively, the data stored in memory cell MEMCELL1 is transferred to global read bit line GRBL1.

In operation 730, when clock signal CLK is logically high and signal CSL1 of column C1 is logically high, circuit SIGGEN generates signals CLKCSLB1, CLKCSL1, and CSLPC1 to be logically low, logically high, and logically high, respectively, in accordance with line 640 of table 600 in FIG. 6. Effectively, transistor P43 is turned off to not pre-charge global read bit line GRBL1. Further, driver INV44 of global read bit line GRBL1 is activated, and the data on global read bit line GRBL1 is transferred to output Q1 for reading. Explained in another way, the data stored in memory cell MEMCELL1 is read.

In the above illustration of FIG. 7, only selected global read bit line GRBL1 is pre-charged while un-selected global read bit lines GRBL2 to GRBLM are not pre-charged, rendering various embodiments of the present disclosure advantages over other approaches.

In some embodiments, a control circuit includes a data driver, a charge circuit, and a first data line coupled with the data driver and the charge circuit. The charge circuit is configured to charge the first data line when the first data line is selected for accessing a memory cell corresponding to the first data line and to not charge the first data line when the first data line is not selected for accessing the memory cell. The data driver, based on a first control signal, is configured to transfer a signal on the first data line to an output of the data driver.

Some embodiments regard a method in a read operation of a memory cell of a memory macro. In the method, a clock signal and an address of the memory cell are received. Based on the clock signal and the address of the memory cell, a pre-charge signal is generated to pre-charge a first data line associated with the memory cell without pre-charging first data lines associated with other memory cells of the memory macro that are not read accessed. Data stored in the memory cell is reflected on the first data line associated with the memory cell. The data stored in the memory cell reflected on the first data line associated with the memory cell is read.

In some embodiments, a circuit in a memory macro comprises a plurality of first data lines, a plurality of control circuits coupled with the plurality of first data lines, and a plurality of signal generating circuits. A control circuit of the plurality of control circuits is coupled with a first data line of the plurality of first data lines and includes a data driver and a charge circuit. A signal generating circuit of the plurality of signal generating circuits, based on a clock signal and a column select signal, is configured to generate a pre-charge control signal to control the charge circuit and a data control signal to control the data driver.

A number of embodiments have been described. It will nevertheless be understood that various modifications may be made without departing from the spirit and scope of the disclosure. For example, various transistors being shown as a particular dopant type, such as an N-type or P-type Metal Oxide Semiconductor (NMOS or PMOS) are for illustration. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A control circuit, comprising:
a data driver;
a charge circuit; and
a first data line coupled with the data driver and the charge circuit,
wherein
the charge circuit is configured to charge the first data line responsive to a clock signal and a first state of a column select signal indicating that the first data line is selected for accessing a memory cell corresponding to the first data line and to not charge the first data line responsive to a second state of the column select signal indicating that the first data line is not selected for accessing the memory cell; and
the data driver is configured to be activated to transfer a signal on the first data line to an output of the data driver responsive to the clock signal and the first state of the column select signal and to be deactivated responsive to the second state of the column select signal.

2. The control circuit of claim 1, wherein
the control circuit is associated with a signal generating circuit; and
the signal generating circuit is configured to generate a control signal based on the clock signal and the column select signal, the data driver being activated or deactivated based on the control signal.

3. The control circuit of claim 1, wherein
the control circuit is associated with a signal generating circuit; and
the signal generating circuit is configured to generate a charge-control signal based on the clock signal and the column select signal, the charge circuit being activated or deactivated based on the charge-control signal.

4. The control circuit of claim 1, wherein
the memory cell is coupled with a second data line associated with the first data line; and
the first data line and the second data line are configured to carry data stored in the memory cell.

5. The control circuit of claim 1, further comprising a data retention circuit configured to retain a logical value on the first data line.

6. The control circuit of claim 1 configured to satisfy at least one of the following conditions:
the data driver is selected from the group consisting of a buffer and an inverter;
the charge circuit includes a PMOS transistor having a drain coupled with the first data line; and
the control circuit further comprises a data retention circuit configured to retain a logical value on the first data line, the data retention circuit includes a cross-coupled pair of inverters, a node of the cross-coupled pair of inverters coupled with the first data line.

7. The control circuit of claim 6, wherein
the first data line is coupled with an NMOS transistor;
an inverter of the cross-coupled pair of inverters includes a PMOS transistor; and
a driving strength of the NMOS transistor is greater than a driving strength of the PMOS transistor of the inverter.

8. The control circuit of claim 6, wherein
the first data line is coupled with an NMOS transistor;
an inverter of the cross-coupled pair of inverters includes a PMOS transistor; and
a size of the NMOS transistor is at least ten times a size of the PMOS transistor of the inverter.

9. A method in a read operation of a memory cell of a memory macro, the method comprising:
receiving a clock signal and an address of the memory cell;
based on the clock signal and the address of the memory cell, generating a set of pre-charge signals to pre-charge a selected first data line associated with the memory cell without pre-charging a non-selected first data line not associated with the memory cell of the memory macro;
reflecting data stored in the memory cell on the first data line associated with the memory cell; and
based on the clock signal and the address of the memory cell, generating a set of control signals to activate a data driver coupled with the selected first data line and to deactivate another data driver coupled with the non-selected first data line.

10. The method of claim 9, wherein
reflecting data stored in the memory cell on the selected first data line associated with the memory cell comprises
reflecting the data stored in the memory cell on a second data line associated with the memory cell; and
corresponding the data reflected on the second data line to the data reflected on the selected first data line.

11. The method of claim 9, wherein
the selected first data line associated with the memory cell is coupled with a data retention circuit and a charge circuit; and
the method further comprises:
retaining, by the data retention circuit, a logical value on the selected first data line;
pre-charging, by the charge circuit and based on a corresponding one of the set of pre-charge signals, the selected first data line; and
transferring, by the data driver coupled with the selected first data line and based on a corresponding one of the set of control signals, the data on the selected first data line to an output of the data driver coupled with the selected first data line.

12. The method of claim 9, wherein
the selected first data line associated with the memory cell is coupled with a data retention circuit and a charge circuit; and
the memory macro satisfies at least one of the following conditions:
the data driver coupled with the selected first data line is selected from the group consisting of an inverter and a buffer;
the data retention circuit includes a cross-coupled pair of inverters, a node of the cross-coupled pair of inverters coupled with the selected first data line; and
the charge circuit includes a PMOS transistor having a drain coupled with the selected first data line.

13. The method of claim 9, further comprising, based on the address of the memory cell,
electrically coupling an output of the data driver coupled with the selected first data line with an output of a global input-output (GIO) circuit; and
electrically decoupling an output of the another data driver coupled with the non-selected first data line from the output of the global input-output (GIO) circuit.

14. A circuit in a memory macro, comprising:
a plurality of first data lines;
a plurality of control circuits coupled with the plurality of first data lines; and
a plurality of signal generating circuits,
wherein
   a control circuit of the plurality of control circuits is coupled with a first data line of the plurality of first data lines and includes a data driver and a charge circuit; and
   a signal generating circuit of the plurality of signal generating circuits, based on a clock signal and a column select signal, is configured to generate a pre-charge control signal to control the charge circuit and a data control signal to control the data driver.

15. The circuit of claim 14, wherein
the control circuit of the plurality of control circuits further comprises a data retention circuit coupled with the first data line and configured to retain a logical value of the first data line.

16. The circuit of claim 15, wherein
the data retention circuit includes a cross-coupled pair of inverters; and
a node of the cross-coupled pair of inverters is coupled with the first data line.

17. The circuit of claim 16, wherein
the first data line is coupled with an NMOS transistor;
an inverter of the cross-coupled pair of inverters includes a PMOS transistor; and
a driving strength of the NMOS transistor is greater than a driving strength of the PMOS transistor.

18. The circuit of claim 14, wherein
the charge circuit includes a PMOS transistor having a drain coupled with the first data line;
an input of the data driver is coupled with the first data line; and
the data driver is selected from the group consisting of an inverter and a buffer.

19. The circuit of claim 14, further comprising:
a plurality of second data lines, wherein a second data line of the plurality of second data lines is coupled with a group of memory cells; and
a plurality of data circuits, wherein a data circuit of the plurality of data circuits is coupled with the first data line of the plurality of first data lines and the second data line.

20. The circuit of claim 19, wherein
the data circuit includes an NMOS transistor coupled with the first data line;
the control circuit of the plurality of control circuits further comprises a data retention circuit coupled with the first data line and configured to retain a logical value of the first data line, the data retention circuit includes a cross-coupled pair of inverters, a node of the cross-coupled pair of inverters is coupled with the first data line, and an inverter of the cross-coupled pair of inverters includes a PMOS transistor; and
a size of the NMOS transistor is at least ten times a size of the PMOS transistor.

\* \* \* \* \*